US012813207B2

(12) United States Patent
Imanishi et al.

(10) Patent No.: US 12,813,207 B2
(45) Date of Patent: Nov. 24, 2026

(54) CONTROL DEVICE FOR SUBSTRATE TRANSFER ROBOT AND CONTROL METHOD FOR SUBSTRATE TRANSFER ROBOT

(71) Applicant: KAWASAKI JUKOGYO KABUSHIKI KAISHA, Kobe (JP)

(72) Inventors: Hiroki Imanishi, Kobe (JP); Shinya Kitano, Kobe (JP); Atsushi Nakaya, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 15 days.

(21) Appl. No.: 18/858,373

(22) PCT Filed: Apr. 13, 2023

(86) PCT No.: PCT/JP2023/015073
§ 371 (c)(1),
(2) Date: Oct. 21, 2024

(87) PCT Pub. No.: WO2023/204143
PCT Pub. Date: Oct. 26, 2023

(65) Prior Publication Data

US 2025/0273493 A1 Aug. 28, 2025

(30) Foreign Application Priority Data

Apr. 20, 2022 (JP) ................................ 2022-069786

(51) Int. Cl.
*H10P 72/00* (2026.01)
*B25J 9/16* (2006.01)
(Continued)

(52) U.S. Cl.
CPC ........ *H10P 72/0608* (2026.01); *B25J 9/1697* (2013.01); *B25J 13/089* (2013.01); *H10P 72/7602* (2026.01)

(58) Field of Classification Search
CPC ............. H10P 72/0608; H10P 72/7602; H10P 72/3302; H10P 72/0606; H10P 72/30;
(Continued)

(56) References Cited

U.S. PATENT DOCUMENTS 6,405,101 B1 * 6/2002 Johanson ............... H10P 72/53
356/73
9,196,518 B1 * 11/2015 Hofmeister ............ H10P 72/53
(Continued)

FOREIGN PATENT DOCUMENTS

JP 2008-264980 A 11/2008
JP 2017-139249 A 8/2017
JP 6640321 B2 2/2020

OTHER PUBLICATIONS

Jul. 11, 2023 Search Report issued in International Patent Application No. PCT/JP2023/015073.

*Primary Examiner* — Esvinder Singh
(74) *Attorney, Agent, or Firm* — Oliff PLC

(57) ABSTRACT

A control device controls a substrate transfer robot including a hand, a joint, and a joint motor. The hand can hold a substrate. An axis of the joint is oriented in a vertical direction. The joint motor drives the joint. The control device controls the joint motor so that the hand transfers the substrate to make the substrate pass through a first sensor and a second sensor. The control is performed so that an orientation of the hand in a plan view when the substrate passes the two sensors is inclined from a direction perpendicular to a straight line connecting the two sensors. The control device generates positional misalignment information indicating positional misalignment of the substrate with
(Continued)

respect to the hand, based on positions of the hand on at least three times that any of a plurality of sensors, including the two sensors, detected an outer edge of the substrate.

4 Claims, 8 Drawing Sheets

(51) Int. Cl.
*B25J 13/08* (2006.01)
*H10P 72/76* (2026.01)

(58) Field of Classification Search
CPC ..... H10P 72/3402; H10P 72/53; B25J 9/1697; B25J 13/089; B25J 9/1679; B25J 9/04; B25J 11/0095; B25J 13/08; B25J 15/0014; B25J 9/1653; G05B 2219/2602
See application file for complete search history.

(56) References Cited

U.S. PATENT DOCUMENTS

| | | | | |
|---|---|---|---|---|
| 2010/0172720 | A1* | 7/2010 | Kondoh | H10P 72/3302 414/217 |
| 2017/0221748 | A1* | 8/2017 | Kodama | H10P 72/50 |
| 2020/0091085 | A1* | 3/2020 | Mooring | H10W 46/00 |
| 2022/0084862 | A1* | 3/2022 | Shindo | H10P 72/3302 |

* cited by examiner

CONTROL DEVICE FOR SUBSTRATE TRANSFER ROBOT AND CONTROL METHOD FOR SUBSTRATE TRANSFER ROBOT

TECHNICAL FIELD

The present disclosure relates to control of a substrate transfer robot.

BACKGROUND ART

In a substrate transfer system, a configuration that, when a misalignment occurs on a substrate to be transferred, eliminates the misalignment by changing the position of the hand when placing the substrate, is conventionally known.

PTL 1 discloses a substrate transfer method in which a disc-shaped substrate is transferred to a substrate processing chamber by a transfer means including a hand. In PTL 1, a pair of sensors detect the passage of the outer edge of a wafer being transferred to the substrate processing chamber, respectively, and thereby detects a positional misalignment of the wafer. Based on the acquired positional misalignment, the target position is modified, thus modifying the wafer transfer path.

PRIOR-ART DOCUMENTS

Patent Documents

PTL 1: Japanese Patent No. 6640321

SUMMARY OF THE INVENTION

Problems to be Solved by the Invention

The acquisition of the positional misalignment in PTL 1 assumes that the hand is always oriented perpendicular to the virtual straight line connecting the pair of sensors while the outer edge of the wafer is detected multiple times by the pair of sensors. Furthermore, it assumes that the direction in which the wafer is transferred is perpendicular to the virtual straight line connecting the pair of sensors. However, such a limitation may decrease the efficiency of substrate transfer by the robot.

The present disclosure is made in view of the above circumstances, and its purpose is to acquire the misalignment of the substrate with respect to the hand with a simple configuration while maintaining the flexibility of the substrate transfer.

Means for Solving the Problems

The problem to be solved by the present disclosure is as described above, and next, means for solving the problem and effects thereof will be described.

According to the first aspect of the present disclosure, a control device for a substrate transfer robot with the following configuration is provided. That is, the control device for the substrate transfer robot controls the substrate transfer robot including a hand, a joint, and a joint motor. The hand can hold a substrate. The axis of the joint is oriented in a vertical direction. The joint motor drives the joint. The control device controls the joint motor so that the hand transfers the substrate to make the substrate pass through a first sensor and a second sensor. The control device controls the joint motor so that an orientation of the hand in a plan view when the substrate passes the first sensor and the second sensor is inclined from a direction perpendicular to a straight line connecting the first sensor and the second sensor. The control device generates positional misalignment information indicating positional misalignment of the substrate with respect to the hand, based on positions of the hand on at least three times that any of a plurality of sensors, including the first sensor and the second sensor, detected an outer edge of the substrate.

According to the second aspect of the present disclosure, a control method for a substrate transfer robot as the following is provided. That is, in the control method, the substrate transfer robot including a hand, a joint, and a joint motor is controlled. The hand can hold a substrate. The axis of the joint is oriented in a vertical direction. The joint motor drives the joint. In the control method, the joint motor is controlled so that the hand transfers the substrate to make the substrate pass through a first sensor and a second sensor. In the control method, the joint motor is controlled so that an orientation of the hand in a plan view when the substrate passes through the first sensor and the second sensor is inclined from a direction perpendicular to a straight line connecting the first sensor and the second sensor. In the control method, positional misalignment information is generated indicating positional misalignment of the substrate with respect to the hand, based on positions of the hand on at least three times that any of a plurality of sensors, including the first sensor and the second sensor, detected the outer edge of the substrate.

This allows for flexible transfer of the substrate by the hand while acquiring the appropriate misalignment amount of the substrate with respect to the hand.

Effects of the Invention

According to the present disclosure, the misalignment of the substrate with respect to the hand can be acquired with a simple configuration while maintaining the flexibility of the substrate transfer.

EMBODIMENT FOR CARRYING OUT THE INVENTION

Figure 1:
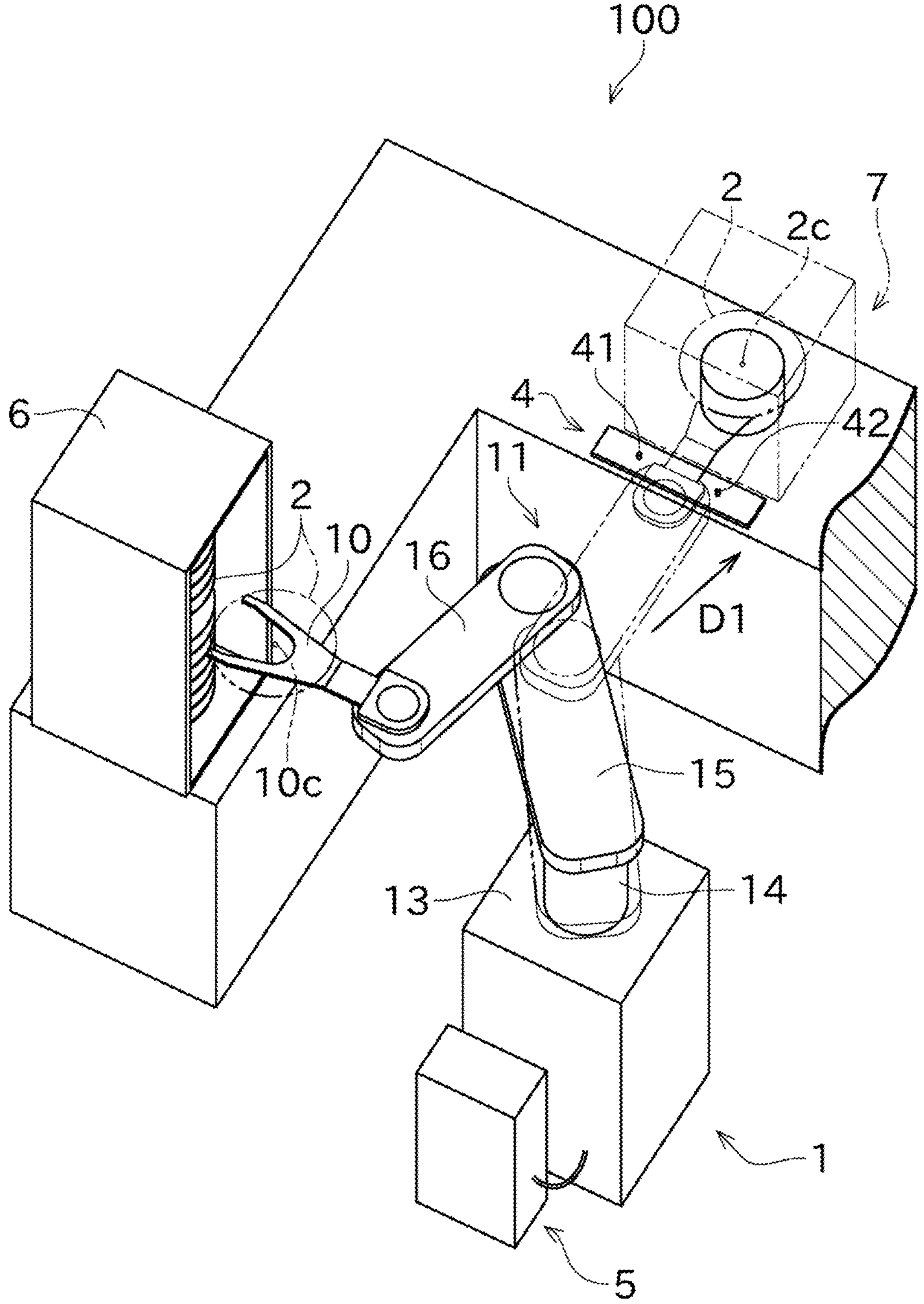
FIG. 1 is a diagonal view showing the overall configuration of a robot system according to one embodiment of this disclosure.
Figure 2:
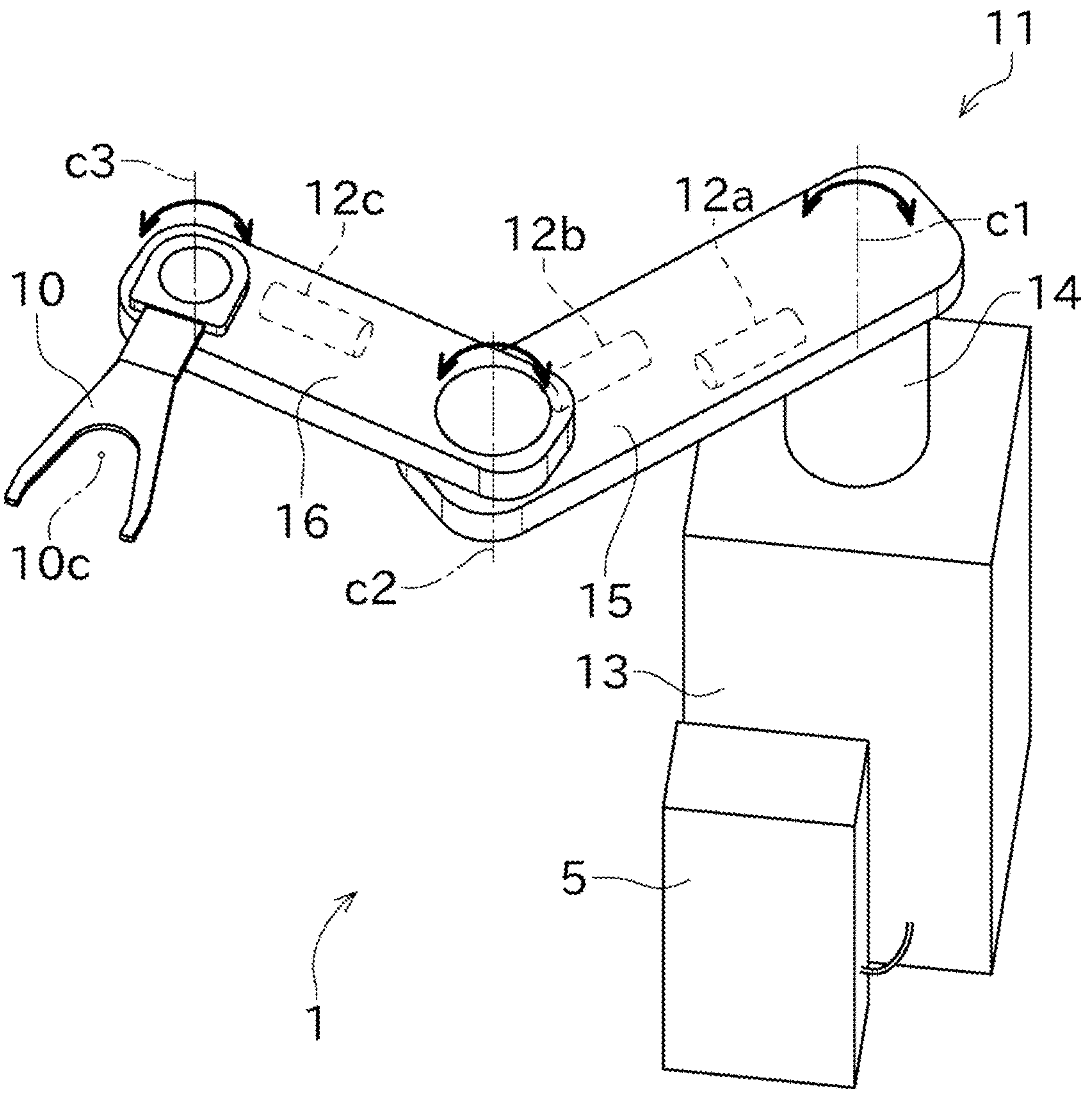
FIG. 2 is a diagonal view showing the configuration of the robot.
Figure 3:
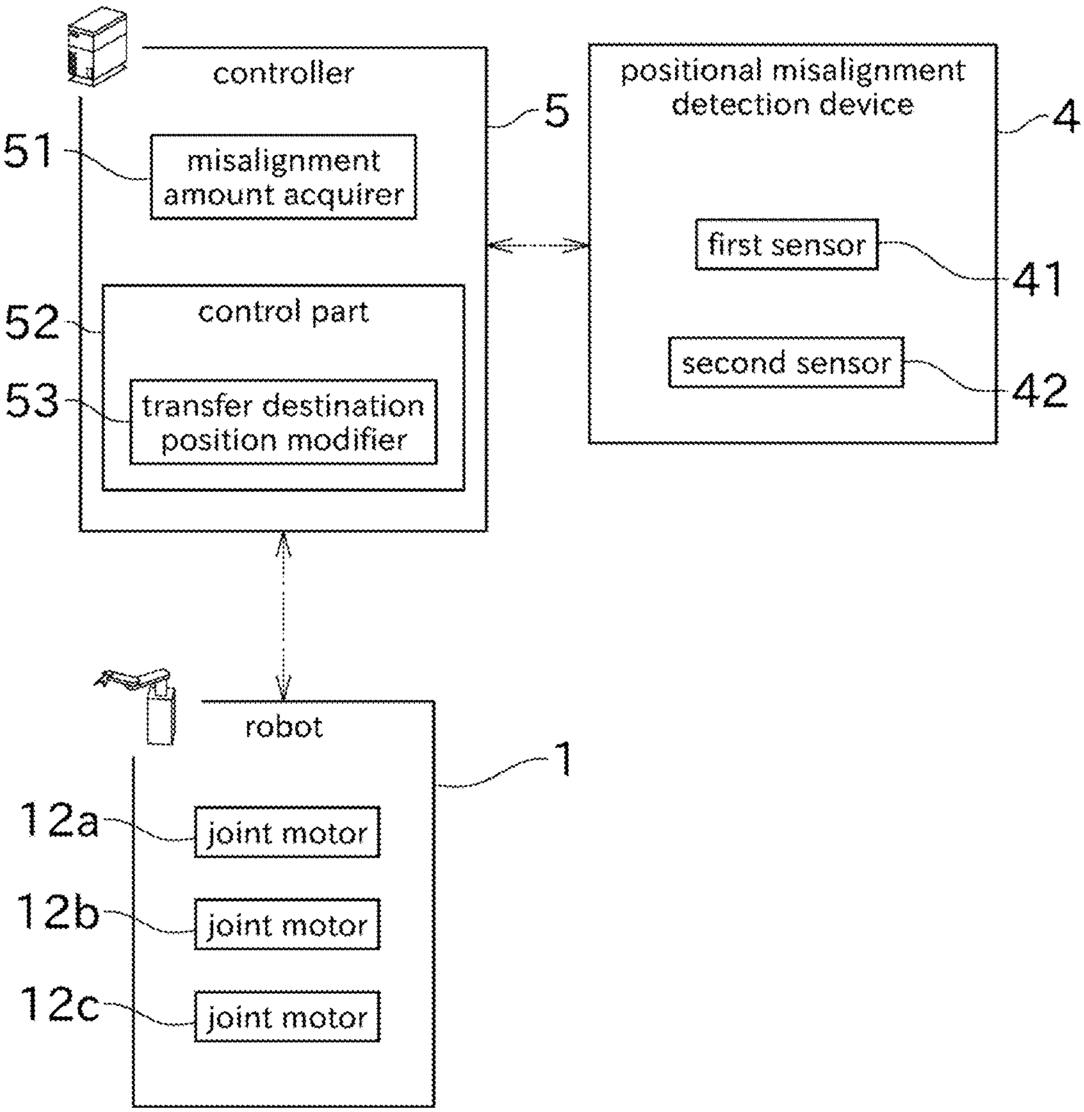
FIG. 3 is a block diagram showing the electrical configuration related to the controller.

Next, the disclosed embodiments will be described with reference to the drawings. FIG. 1 is a diagonal view showing the configuration of a robot system 100 according to one embodiment of this disclosure. FIG. 2 is a diagonal view of the robot 1. FIG. 3 is a block diagram showing a part of the robot system 100.

The robot system 100 shown in FIG. 1 is a system that makes the robot (substrate transfer robot) 1 perform work in a clean room or other work space.

The robot system 100 includes a robot 1, a positional misalignment detection device 4, and a controller 5. The controller 5 is a kind of control device.

The robot 1 functions, for example, as a wafer transfer robot that transports wafers 2 stored in a storage container 6 to a substrate processing chamber 7. In this embodiment, robot 1 is realized by a SCARA (SCARA) type horizontal articulated robot. SCARA is an abbreviation for Selective Compliance Assembly Robot Arm.

The wafer 2 conveyed by the robot 1 is a type of substrate. The wafer 2 is formed as a thin circular plate.

As shown in FIG. 2, the robot 1 includes a hand 10, a manipulator 11, and joint motors 12*a*, 12*b*, 12*c*. The hand 10 is a kind of holder.

The hand 10 is a type of end-effector and is generally V-shaped or U-shaped in a plan view. The hand 10 is supported at the end of the manipulator 11 (specifically, a second link 16 described below). The hand 10 rotates with respect to the second link 16 about a third axis c3 extending in the vertical direction.

The hand 10 can be loaded with the wafer 2. The hand 10 has a defined reference position, and when the wafer 2 is placed on the predetermined position of the hand 10 without misalignment, a center 2*c* of the wafer 2 coincides with the reference position of the hand 10. This reference position may hereinafter be referred to as a center 10*c* of the hand 10.

The manipulator 11 is mainly includes a base 13, an elevation shaft 14, a first link 15, and the second link 16.

The base 13 is fixed to the ground (e.g., the floor of a clean room). The base 13 serves as a base member supporting the elevation shaft 14.

The elevation shaft 14 moves vertically with respect to the base 13. This elevation allows a height position of the first link 15, the second link 16, and the hand 10 to be changed.

The first link 15 is supported on top of the elevation shaft 14. The first link 15 rotates with respect to the elevation shaft 14 about a first axis c1 extending in the vertical direction. This allows a posture of the first link 15 to be changed in the horizontal plane.

The second link 16 is supported at the end of the first link 15. The second link 16 rotates with respect to the first link 15 about the second axis c2 extending in the vertical direction. This allows a posture of the second link 16 to be changed in the horizontal plane.

Thus, the manipulator 11 includes three joints whose axes are oriented in the vertical direction. In the following, each joint is sometimes referred to with the reference numeral c1, c2, or c3 of the central axis to identify it.

The joint motors 12*a*, 12*b*, and 12*c* drive joints c1, c2, and c3, respectively. This allows a position and a posture of the hand 10 in the plan view to be changed in various ways. The joint motors 12*a*, 12*b*, 12*c* are configured as servo motors, a type of electric motor.

The joint motor 12*a*, which drives joint c1, is located at the first link 15. The joint motor 12*b*, which drives joint c2, is located at the first link 15. The joint motor 12*c*, which drives joint c3, is located at the second link 16. However, the layout of each motor is not limited to the above.

The positional misalignment detection device 4 has a first sensor 41 and a second sensor 42. Each of the first sensor 41 and the second sensor 42 is located near the path along which the wafer 2 is transferred by the robot 1 to the substrate processing chamber 7. Just before the hand 10 reaches the substrate processing chamber 7, which is the destination of the transfer, the hand 10 and the wafer 2 generally move in the direction D1 shown in FIG. 1. The positional misalignment detection device 4 is located in the vicinity of the substrate processing chamber 7 and on the opposite side of the direction D1 to the substrate processing chamber 7. The first sensor 41 and the second sensor 42 can detect the passage of the outer edge of the wafer 2 on the way the wafer 2 is transferred to the substrate processing chamber 7.

The first sensor 41 and the second sensor 42 are both configured as non-contact sensors. The configuration of the sensors is arbitrary, but they can be configured, for example, as reflective sensors. Instead of a reflective sensor, for example, a transmissive sensor may be applied.

Since the configuration of the positional misalignment detection device 4 is disclosed in PTL1 etc., it will be briefly described below. The first sensor 41 and the second sensor 42 are positioned suitably far apart in the plan view to form an interval smaller than the diameter of the wafer 2. The first sensor 41 and the second sensor 42 are all arranged with the detection axis being oriented in a vertical direction.

Each of the first sensor 41 and the second sensor 42 can detect the passage of an outer edge of the wafer 2. The detection results of the first sensor 41 and the second sensor 42 are input to the controller 5. The controller 5 can acquire the center position and the orientation of the hand 10 at the timing when each of the first sensor 41 and the second sensor 42 detects the passage of the outer edge of the wafer 2, for example, by means of encoders (not shown) provided on the joint motors 12*a*, 12*b*, 12*c*.

In the process of transferring the wafer 2 along the path, the first sensor 41 can detect twice the passage of the outer edge of the wafer 2. The first detection is shown in FIG. 4 and the second detection is shown in FIG. 5.

Figure 6:
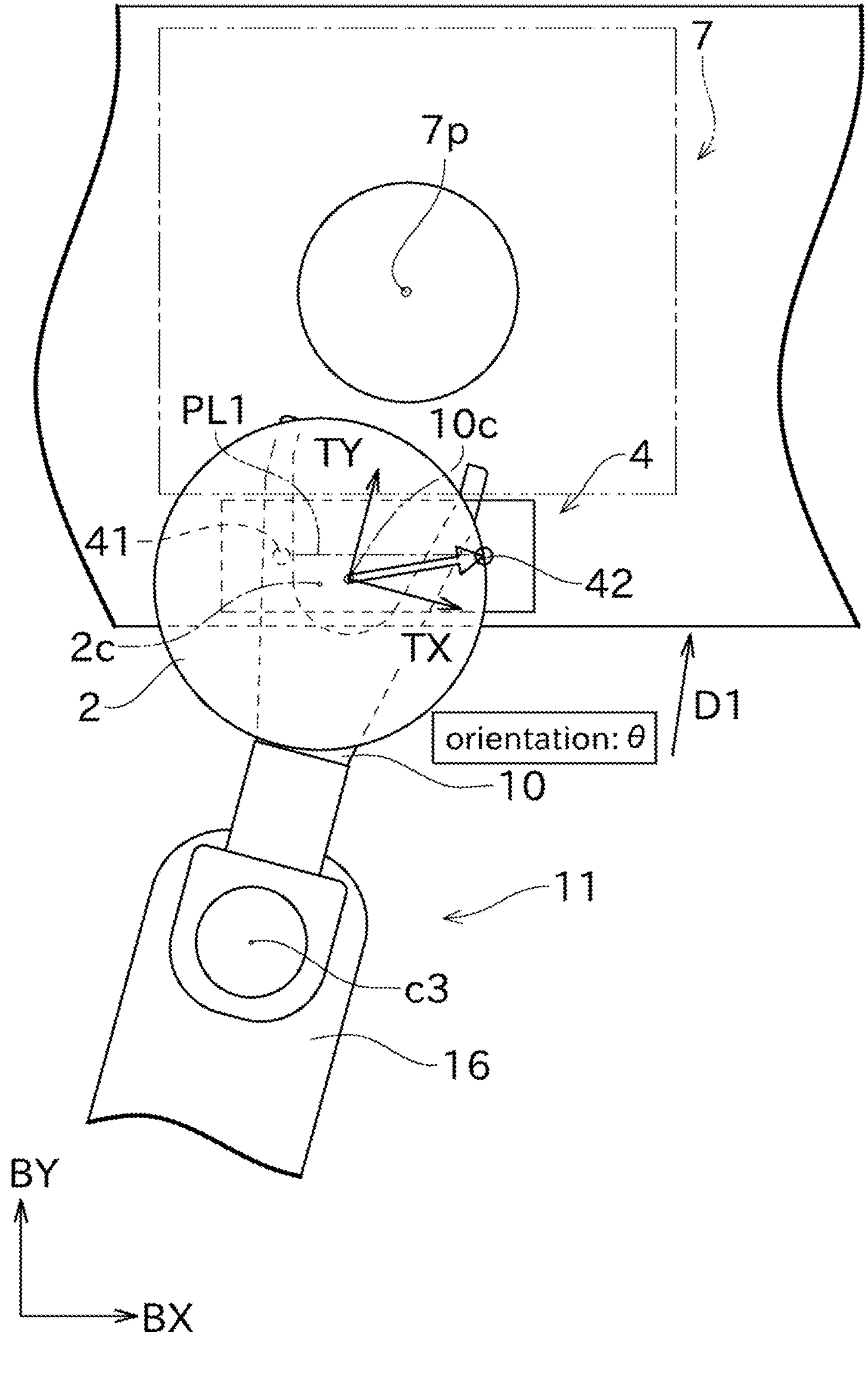
FIG. 6 is a plan view showing a state in which the second sensor of the positional misalignment detection device detects the first passage of the outer edge of the wafer.
Figure 7:
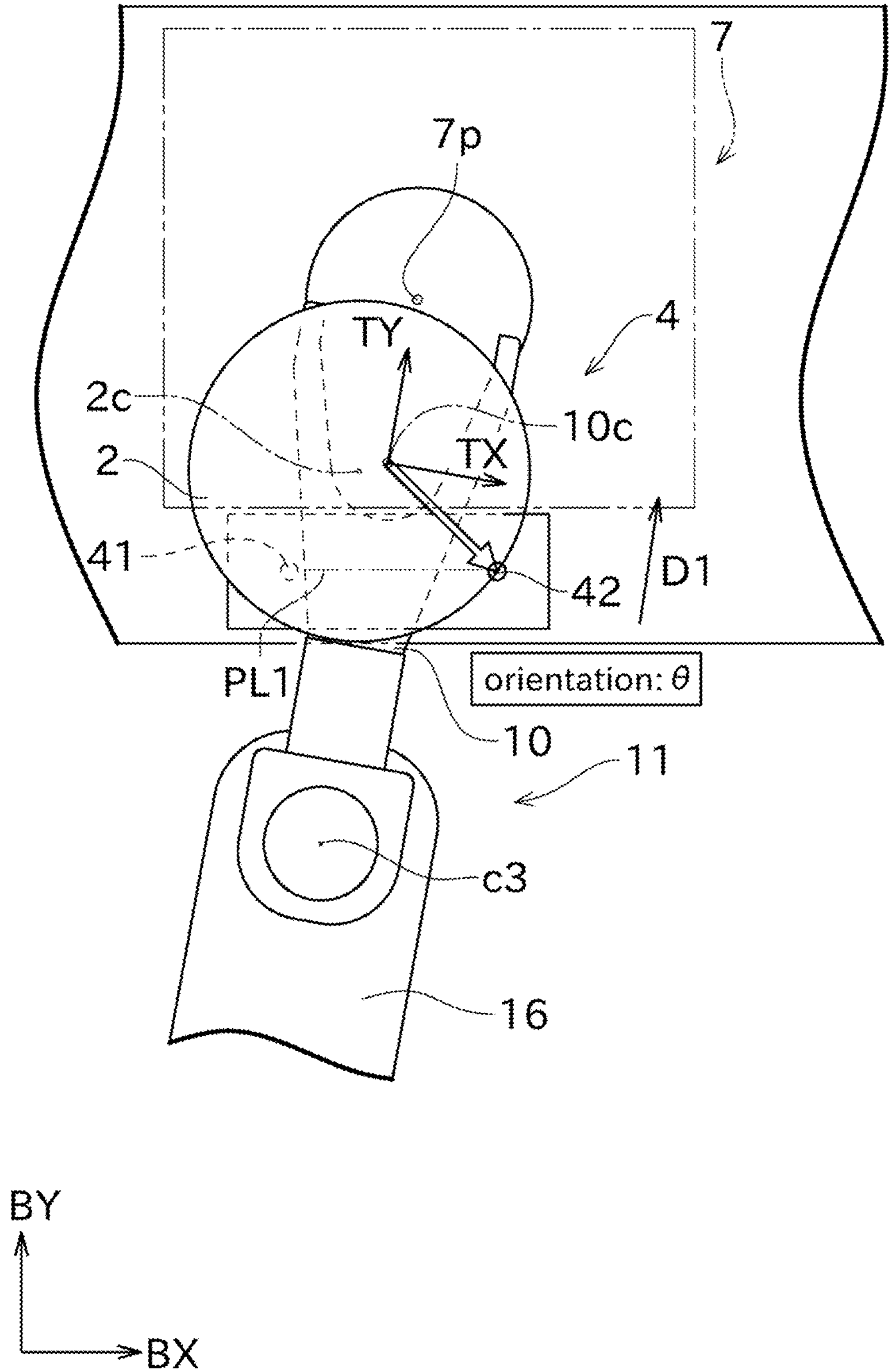
FIG. 7 is a plan view showing a state in which the second sensor of the positional misalignment detection device detects the second passage of the outer edge of the wafer.

In the process of the wafer 2 being transferred along the path, the second sensor 42 can detect twice the passage of the outer edge of the wafer 2. The first detection is shown in FIG. 6 and the second detection is shown in FIG. 7.

In the process of the wafer 2 being transferred by the hand 10, any of the first sensor 41 and the second sensor 42 detects the outer edge of the wafer 2 a total of four times, in the order of FIG. 4, FIG. 6, FIG. 7, FIG. 5.

Figure 4:
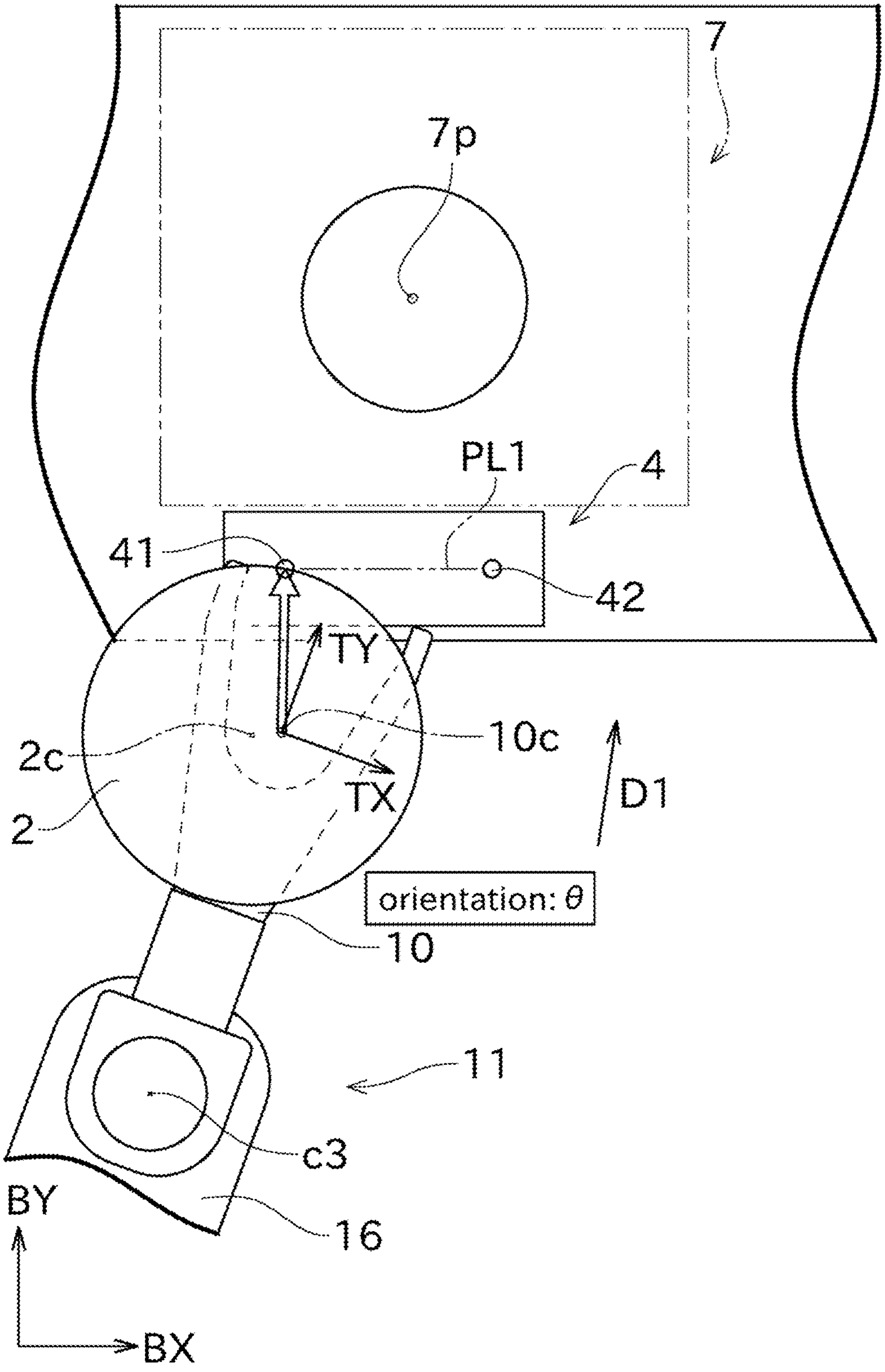
FIG. 4 is a plan view showing a state in which a first sensor of the positional misalignment detection device detects the first passage of an outer edge of a wafer.
Figure 5:
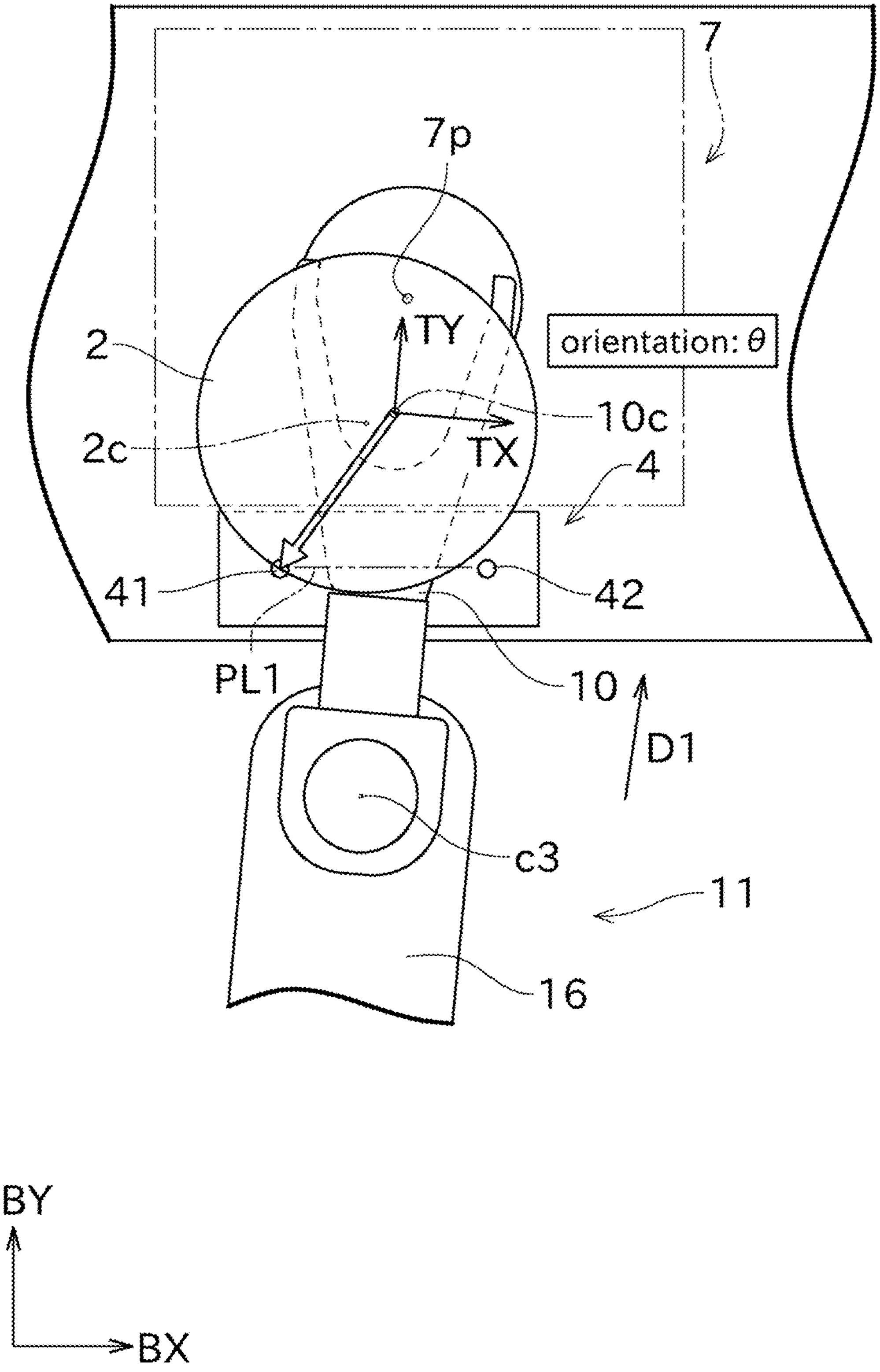
FIG. 5 is a plan view showing a state in which the first sensor of the positional misalignment detection device detects the second passage of the outer edge of the wafer.

In the detection timing shown in FIG. 4, the orientation of the hand 10 in the plan view is inclined from a straight line perpendicular to the virtual straight line PL1 connecting the first sensor 41 and the second sensor 42. The same is true for the detection timings shown in FIGS. 5, 6, and 7. In this embodiment, the robot 1 transfers the wafer 2 while simultaneously translating and rotating the hand 10. Therefore, the orientation of the hand 10 changes slightly in the process of detecting the outer edge of the wafer 2 in the order of FIG. 4, FIG. 6, FIG. 7, and FIG. 5.

For each of the four detection timings shown in FIG. 4 through 7, the controller 5 computes the center position and the orientation of the hand 10, respectively.

Now, consider a horizontal two-dimensional plane corresponding to the plan view of the wafer 2 transfer path. The position in the two-dimensional plane can be expressed in a two-dimensional Cartesian coordinate system defined by two orthogonal axes BX, BY, shown in FIGS. 4 through 7. Hereafter, this Cartesian coordinate system may be referred to as a base coordinate system.

The positions of the first sensor 41 and the second sensor 42 in the base coordinate system are determined in advance and set in the controller 5. For each of the two detection timings shown in FIGS. 4 and 5, a vector from the center 10*c* of the hand 10 to the first sensor 41 is computed. Similarly, for each of the two detection timings shown in FIGS. 6 and 7, a vector from the center 10*c* of the hand 10 to the second sensor 42 is computed. The vectors acquired are indicated by white arrows in FIGS. 4 through 7.

Apart from the base coordinate system, a horizontal two-dimensional plane with respect to the hand 10 is considered. This two-dimensional plane is defined by two orthogonal axes TX, TY. One axis TY coincides with the orientation of the hand 10 and the other axis TX is orthogonal to the orientation of the hand 10. The origin, i.e., the intersection of the two axes TX, TY, coincides with the center 10*c* of the hand 10. Hereafter, this Cartesian coordinate system is sometimes referred to as the tool coordinate system. The tool coordinate system changes following the position and the orientation of the hand 10.

The total of four vectors, each acquired at the detection timings from FIG. 4 to FIG. 7, are transformed from the base coordinate system into the tool coordinate system. This transformation can be done by a simple computation using the orientation of the hand 10 at each of the four detections.

For example, if the coordinates of the center 10*c* of the hand 10 are (Lx1, Ly1) in the base coordinate system and the coordinates of the first sensor 41 are (Sx1, Sy1) in the base coordinate system at the detection timing shown in FIG. 4, the vector above is (Sx1−Lx1, Sy1−Ly1) in the base coordinate system. If the orientation of the hand 10 is θ at the detection timing shown in FIG. 4, the vector (VCx, VCy) when this vector is transformed into the tool coordinate system can be computed by the well-known rotation formula as follows. Here, θ means the angle that the TX axis of the tool coordinate system makes with the BX axis of the base coordinate system, with counterclockwise being positive.

$$Vcx = \cos\theta \times (Sx1 - Lx1) + \sin\theta \times (Sy1 = Ly1)$$

$$Vcy = -\sin\theta \times (Sx1 - Lx1) + \cos\theta \times (Sy1 = Ly1)$$

The same computation is performed for the detection timings shown in FIGS. 5, 6 and 7. At each of the timings shown in FIGS. 4 through 7, the orientation of axes TX and TY of the tool coordinate system is different because the orientation θ of the hand 10 is different.

Figure 8:
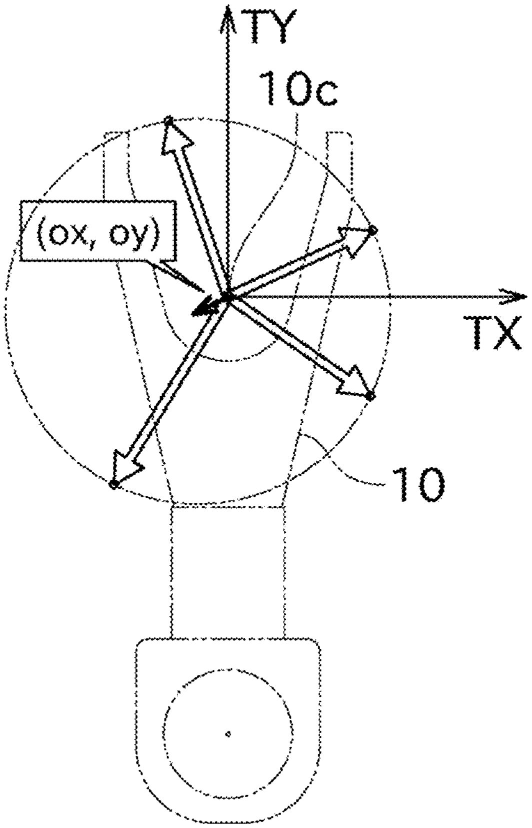
FIG. 8 is a diagram illustrating a process of determining a misalignment of the wafer from vectors acquired at four detection timings in a tool coordinate system.

The above yields four vectors transformed into the tool coordinate system. These vectors can also be called post-transformed vectors. FIG. 8 shows the four vectors plotted in the tool coordinate system. The controller 5 arbitrarily selects three of the four vectors and computes the center position of the virtual circle passing through the tips of the three selected vectors in the tool coordinate system. Since the virtual circle corresponds to the outer edge of the wafer 2, the center of the virtual circle represents the center 2*c* of the wafer 2. Since the tool coordinate system is defined with the center 10*c* of the hand 10 as the origin, the coordinates of the center of the virtual circle in the tool coordinate system means the misalignment amount of the wafer 2 relative to the hand 10. The misalignment amount can be expressed as a plane vector (ox, oy) extending from the origin of the tool coordinate system to the center of the virtual circle. The vector representing the misalignment amount is shown in FIG. 8 as a bold line.

There are four combinations in which any three of the four vectors are selected. It is preferable to determine the misalignment amount of the wafer 2 relative to the hand 10 for each of the combinations and to compute the average of the misalignment amount. This allows the position misalignment to be determined with high accuracy.

The controller 5 includes a misalignment amount acquirer 51 and a control part 52, as shown in FIG. 3. The controller 5 is configured as a known computer including a CPU, a ROM, a RAM, an auxiliary storage device, and the like. The auxiliary storage device is configured as, for example, an HDD, an SSD, or the like. The auxiliary storage device stores robot control programs and the like to realize the control method of the joint motors 12*a*, 12*b*, 12*c* of this disclosure. The cooperation of these hardware and software allows the controller 5 to operate as the misalignment amount acquirer 51 and the control part 52, etc.

The misalignment amount acquirer 51 acquires a misalignment amount of the wafer 2 based on the detection results of the first sensor 41 and the second sensor 42 that constitute the positional misalignment detection device 4, as described above. The misalignment amount is expressed, for example, as a plane vector (ox, oy).

The control part 52 outputs and controls command values to the respective drive motors that drive the various parts of the robot 1 described above in accordance with a predetermined movement program or a movement command input by the user, to move the hand 10 to a predetermined command position. The drive motors include the joint motors 12*a*, 12*b*, 12*c* described above as well as the electric motor shown in the figure to displace the elevation shaft 14 vertically.

The control part 52 includes a transfer destination position modifier 53.

The original position of the hand 10 when placing the wafer 2 is the position where its center 10*c* coincides with a reference position 7*p* of the substrate processing chamber 7. However, if the position of the wafer 2 with respect to the hand 10 is misaligned for some reason, the misalignment becomes the position misalignment of the wafer 2 with respect to the reference position 7*p* of the substrate processing chamber 7 as it is. Therefore, the transfer destination position modifier 53 modifies the position where the hand 10 places the wafer 2, based on the misalignment amount input from the misalignment amount acquirer 51. The misalignment amount is information indicating the misalignment of the wafer 2 (positional misalignment information).

The modification is performed in such a way that the position misalignment described above is cancelled. That is, the controller 5 inverts the acquired plane vector (ox, oy) indicating the misalignment amount of the wafer 2, and transforms the inverted plane vector (−ox, −oy) from the tool coordinate system into the base coordinate system. This transformation is based on the orientation θ of the hand 10 when the wafer 2 is placed in the substrate processing chamber 7. The transformed vector is added to the coordinates of the transfer destination of the hand 10 in the base coordinate system. The above allows the wafer 2 to be placed correctly so that the center 2*c* of the wafer 2 coincides with the reference position 7*p* of the substrate processing chamber 7.

Thus, in this embodiment, the misalignment amount of the wafer 2 can be determined even if the orientation of the hand 10 when the wafer 2 passes the first sensor 41 and the second sensor 42 is not perpendicular to the virtual straight line PL1 connecting the first sensor 41 and the second sensor 42. Furthermore, even if the orientation of the hand 10 changes between when the wafer 2 passes the first sensor 41 and when it passes the second sensor 42, the misalignment amount of the wafer 2 can still be determined correctly. Therefore, the degree of freedom of the wafer 2 transfer path in relation to the first sensor 41 and the second sensor 42 can be increased. For example, the wafer 2 can be transferred according to the shortest distance path while correcting the misalignment of the wafer 2. As a result, the transfer throughput can be improved.

The misalignment of the wafer 2 with respect to the hand 10 is detected during the transfer of the wafer 2 to the substrate processing chamber 7 as the transfer destination. The transfer destination position modifier 53 changes the destination position of the hand 10 from the position before modification to the position after modification during the transfer of the wafer 2 by the hand 10. This allows the wafer 2 to be set in the substrate processing chamber 7 at an accurate position while preventing a decrease in transfer efficiency.

As explained above, the controller 5 of this embodiment controls the robot 1 including the hand 10, the joints c1, c2, c3, and the joint motors 12*a*, 12*b*, 12*c*. The hand 10 can hold the wafer 2. The axes of the joints c1, c2, c3 are all oriented vertically. The joint motors 12*a*, 12*b*, 12*c* drive the corresponding joints c1, c2, c3. The controller 5 controls the joint motors 12*a*, 12*b*, 12*c* so that the hand 10 transfers the wafer 2 to make the wafer 2 pass through the first sensor 41 and the second sensor 42. The controller 5 controls the joint motors 12*a*, 12*b*, 12*c* so that the orientation of the hand 10 in the plan view when the wafer 2 passes the first sensor 41 and the second sensor 42 is inclined from a direction perpendicular to the virtual straight line PL1 connecting the first sensor 41 and the second sensor 42. The controller 5 generates the positional misalignment information indicating the positional misalignment of the wafer 2 with respect to the hand 10 based on the positions of the hand 10 at the four detection timings when the first sensor 41 or the second sensor 42 detected the outer edge of the wafer 2.

This allows the misalignment amount of the wafer 2 with respect to the hand 10 to be acquired appropriately while flexibly transferring the wafer 2 by the hand 10.

In the controller 5 of the robot 1 of this embodiment, the orientation of the hand 10 is different from each other at all four detection timings at which the first sensor 41 or the second sensor 42 detected the outer edge of the wafer 2.

This allows for a greater degree of freedom in the path of transferring the wafer 2 by the hand 10 while acquiring the misalignment amount of the wafer 2.

The controller 5 of the robot 1 of this embodiment acquires the position and the orientation of the hand 10 with respect to each of the four detection timings at which the first sensor 41 or the second sensor 42 detected the outer edge of the substrate. Hereinafter, at each of the detection timings, the sensor that detected the outer edge of the wafer 2 among the first sensor 41 and the second sensor 42 is referred to as the detection sensor. For each of the four detection timings, the controller 5 computes, based on the position of the hand 10, the vector indicating the relationship between the position of the detection sensor and the position of the hand 10 in the base coordinate system. The controller 5 transforms each the acquired four vectors into the tool coordinate system based on the orientation of the hand 10 at each of the four detection timings. The controller 5 acquires the misalignment of the wafer 2 in the tool coordinate system based on the four vectors transformed into the tool coordinate system.

This allows the misalignment amount of the wafer 2 with respect to the hand 10 to be determined by a simple process using the tool coordinate system based on the orientation of the hand 10.

The controller 5 of the robot 1 of this embodiment modifies, based on the positional misalignment information acquired in the process of transferring the wafer 2, the target position of the hand 10 in placing the wafer 2 at the transfer destination.

This allows the wafer 2 to be placed at the exact position at the transfer destination by preventing misalignment while preventing a decrease in transfer throughput.

While some preferred embodiments of this disclosure have been described above, the foregoing configurations may be modified, for example, as follows. The modification can be singly made and any combination of multiple modifications can be made.

In the embodiment described above, both the first sensor 41 and the second sensor 42 detect the outer edge of the wafer 2 twice each. For example, the configuration can be such that one of the first sensor 41 and the second sensor 42 detects the outer edge of the wafer 2 twice and the rest detects the outer edge of the wafer 2 only once. Once the three vectors are acquired, a position corresponding to the center 2*c* of the wafer 2 can be obtained in the tool coordinate system without problems.

The positional misalignment detection device 4 may include a third sensor, which is shown in the figure, in addition to the first sensor 41 and the second sensor 42. The third sensor can detect the outer edge of the wafer 2. The third sensor can, for example, have the same configuration as the first sensor 41 and the second sensor 42. The third sensor can be located on the virtual straight line PL1 or its extension. The third sensor can also be located so that the first sensor 41, the second sensor 42, and the third sensor form a triangular shape. As shown in FIGS. 4 through 7, a vector from the center 10*c* of the hand 10 to the third sensor can be computed based on the position of the hand 10 at the timing when the third sensor detects the outer edge of the wafer 2. This vector can be used to compute a vector (ox, oy) representing the misalignment amount of the wafer 2 relative to the hand 10. For example, the first sensor 41, the second sensor 42, and the third sensor can be configured to detect the outer edge of the wafer 2 once each, to acquire three vectors. It can also be configured so that the first sensor 41, the second sensor 42, and the third sensor detect the outer edge of the wafer 2 twice each, to acquire six vectors. The positional misalignment detection device 4 may include four or more sensors capable of detecting the outer edge of the wafer 2.

The directions of the BX and BY axes in the base coordinate system are arbitrary. For example, the BX axis may be defined so that the left side in FIG. 4 is in the positive direction, or the BY axis may be defined so that the bottom side in FIG. 4 is in the positive direction.

Similarly, the directions of the TX and TY axes in the tool coordinate system are arbitrary. For example, the TX axis can be defined to coincide with the orientation of the hand 10.

The path along which the wafer 2 is transferred by the hand 10 may be straight or curved.

In the process of transferring the wafer 2, a transient state may occur where the orientation of the hand 10 is perpendicular to the virtual straight line PL1. At any of a plurality of detection timings, the orientation of the hand 10 may be perpendicular to the virtual straight line PL1.

The first sensor 41 and the second sensor 42 may be located on the base 13 of the robot 1.

The transfer destination of the wafer 2 by the robot 1 is not limited to the substrate processing chamber 7, but may be another location, such as a load lock room, for example.

The number of joints that the manipulator 11 has, whose axes are oriented in the vertical direction, is not limited to three, but may be one, two, four, or more.

The control described in the above embodiments can also be applied when the robot 1 transfers a substrate other than the wafer 2.

The functionality of the controller 5 and other elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

The invention claimed is:

1. A control device that controls a substrate transfer robot, the substrate transfer robot comprising:

a hand capable of holding a substrate;

a joint with an axis being oriented in a vertical direction; and a joint motor that drives the joint, wherein the control device controls the joint motor so that the hand transfers the substrate to make the substrate pass through a first sensor and a second sensor, and an orientation of the hand in a plan view when the substrate passes the first sensor and the second sensor is inclined from a direction perpendicular to a straight line connecting the first sensor and the second sensor, the control device generates positional misalignment information indicating positional misalignment of the substrate with respect to the hand, based on positions of the hand on at least three times that any of a plurality of sensors, including the first sensor and the second sensor, detected an outer edge of the substrate, the control device transfers the substrate while simultaneously translating and rotating the hand such that the orientation of the hand changes in a process of detecting the outer edge of the substrate, the control device computes the position and the orientation of the hand at respective times when any of the first sensor and the second sensor detected the outer edge of the substrate, the control device computes, based on the position of the hand, a vector indicating a relationship between a position of a detection sensor, being the sensor that detected the outer edge of the substrate among the first sensor and the second sensor, and the position of the hand, the control device computes, based on the orientation of the hand, a post-transformed vector, which is a vector transformed into a tool coordinate system being a coordinate system based on the hand, the post-transformed vector being calculated based on the following formula;

$$Vcx = \cos\theta \times (Sx1 - Lx1) + \sin\theta \times (Sy1 - Ly1)$$

$$Vcy = -\sin\theta \times (Sx1 - Lx1) + \cos\theta \times (Sy1 - Ly1)$$

where Vcx, Vcy is the post-transformed vector, θ is the orientation of the hand, Lx1, Ly1 is a coordinate of a center of the hand, and Sx1, Sy1 is a coordinate of the first sensor; and the control device computes, based on at least three post-transformed vectors, the positional misalignment of the substrate in the tool coordinate system.

2. The control device for the substrate transfer robot according to claim 1, wherein between at least two times when either the first sensor or the second sensor detected the outer edge of the substrate, the orientation of the hand upon detection differs.

3. The control device for the substrate transfer robot according to claim 1, wherein the control device modifies, based on the positional misalignment information acquired while transferring the substrate, a target position of the hand when placing the substrate at a transfer destination.

4. A control method that controls a substrate transfer robot, the substrate transfer robot comprising:

a hand capable of holding a substrate;

a joint with an axis being oriented in a vertical direction; and a joint motor that drives the joint, the control method comprising:

controlling the joint motor so that the hand transfers the substrate to make the substrate pass through a first sensor and a second sensor, and an orientation of the hand in a plan view when the substrate passes through the first sensor and the second sensor is inclined from a direction perpendicular to a straight line connecting the first sensor and the second sensor; and generating positional misalignment information that indicates positional misalignment of the substrate with respect to the hand, based on positions of the hand on at least three times that any of a plurality of sensors, including the first sensor and the second sensor, detected an outer edge of the substrate, wherein:

the substrate is transferred while simultaneously translating and rotating the hand such that the orientation of the hand changes in a process of detecting the outer edge of the substrate, the position and the orientation of the hand at respective times is computed when any of the first sensor and the second sensor detected the outer edge of the substrate, based on the position of the hand, a vector indicating a relationship between a position of a detection sensor, being the sensor that detected the outer edge of the substrate among the first sensor and the second sensor, and the position of the hand, is computed, based on the orientation of the hand, a post-transformed vector, which is a vector transformed into a tool coordinate system being a coordinate system based on the hand, is computed, the post-transformed vector being calculated based on the following formula:

$$Vcx = \cos\theta \times (Sx1 - Lx1) + \sin\theta \times (Sy1 - Ly1)$$

$$Vcy = -\sin\theta \times (Sx1 - Lx1) + \cos\theta \times (Sy1 - Ly1)$$

where Vcx, Vcy is the post-transformed vector, $\theta$ is the orientation of the hand Lx1, Ly1 is a coordinate of a center of the hand, and Sx1, Sy1 is a coordinate of the first sensor; and based on at least three post-transformed vectors, the positional misalignment of the substrate in the tool coordinate system is computed.

* * * * *